United States Patent
Varghese et al.

(10) Patent No.: US 7,396,728 B2
(45) Date of Patent: Jul. 8, 2008

(54) METHODS OF IMPROVING DRIVE CURRENTS BY EMPLOYING STRAIN INDUCING STI LINERS

(75) Inventors: Ajith Varghese, McKinney, TX (US); Narendra Singh Mehta, Dallas, TX (US); Jonathan McAulay Holt, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 372 days.

(21) Appl. No.: 11/170,501

(22) Filed: Jun. 29, 2005

(65) Prior Publication Data

US 2007/0004118 A1    Jan. 4, 2007

(51) Int. Cl.
*H01L 21/336* (2006.01)
*H01L 21/76* (2006.01)

(52) U.S. Cl. .................. 438/296; 438/424; 438/427; 257/E21.546; 257/E21.549; 257/E21.573

(58) Field of Classification Search .......... 438/296, 438/424, 427, 221, 435, 243; 257/E21.546, 257/E21.549, E21.573
See application file for complete search history.

(56) References Cited

U.S. PATENT DOCUMENTS

| | | | |
|---|---|---|---|
| 6,621,131 B2 | 9/2003 | Murthy et al. | |
| 6,642,125 B2 | 11/2003 | Oh et al. | |
| 6,900,502 B2 | 5/2005 | Ge et al. | |
| 2002/0031890 A1* | 3/2002 | Watanabe et al. | 438/296 |

* cited by examiner

*Primary Examiner*—Walter L Lindsay, Jr.
(74) *Attorney, Agent, or Firm*—Frederick J. Telecky, Jr.; Wade J. Brady, III

(57) ABSTRACT

A method forms a semiconductor device comprising isolation structures that selectively induce strain into active regions of NMOS and PMOS devices. Form a hard mask layer over a semiconductor body. A resist layer is formed on the hard mask layer that exposes and defines isolation regions. The hard mask layer is patterned and trench regions are formed using the hard mask layer as a mask. An oxide trench liner that induces compressive strain into active regions of the PMOS region is formed within trench regions of the PMOS region. A nitride trench liner that induces tensile strain into active regions of the NMOS region is formed within the NMOS trench regions.

22 Claims, 8 Drawing Sheets

NMOS REGION

PMOS REGION

NMOS REGION

PMOS REGION

NMOS REGION

PMOS REGION

NMOS REGION

PMOS REGION

US 7,396,728 B2

METHODS OF IMPROVING DRIVE CURRENTS BY EMPLOYING STRAIN INDUCING STI LINERS

FIELD OF INVENTION

The present invention relates generally to semiconductor devices and more particularly to methods for selectively forming strain inducing trench liners for NMOS and PMOS semiconductor devices.

BACKGROUND OF THE INVENTION

It can be appreciated that placing mechanical stresses or strain (e.g., tension or compression) upon a semiconductor substrate can affect the performance of devices formed in and/or on the substrate. With regard to MOS transistors, for example, stressing the substrate can change charge mobility characteristics in respective channel regions of the transistors. This may be beneficial because, for a given electric field developed across the transistors, the amount of current that flows through the channel regions is directly proportional to the mobility of carriers in the channel regions. Thus, the higher the mobility of the carriers in the channel regions, the more rapidly the carriers will pass through the channel regions and the faster the transistors can perform. Improving the mobility of the carriers in the channel regions can also lower operating voltages, which may be desirable at times.

One drawback to improving channel mobility via strain is that compressive strain, which generally improves hole mobility for silicon substrate devices, can degrade electron mobility, and that tensile strain, which improves electron mobility for silicon substrate based devices, can degrade hole mobility. As a result, introducing tensile strain can improve performance of NMOS devices but degrade performance of PMOS devices. Similarly, introducing compressive strain can improve performance of PMOS devices but degrade performance of NMOS devices. Additionally, the impact of stress on NMOS and PMOS transistor mobility depends upon the channel orientation and surface orientation and is different for different orientations.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device performance, particularly drive current, by fabricating trench liners that induce desired types and/or amounts of strain in regions of semiconductor devices. Compressive type strain/stress improves performance of NMOS devices but degrades performance of PMOS devices. Similarly, tensile type strain/stress improves performance of PMOS devices, but degrades performance of NMOS devices. The trench liners within NMOS regions are fabricated to induce tensile strain that improves drive current and the trench liners within PMOS regions are fabricated to induce compressive strain, which similarly improves drive current within the PMOS regions. The trench liners are selectively formed within each region with the appropriate type stress. As a result, strain induced performance is obtained for both PMOS and NMOS devices, without degrading performance for either.

In accordance with an aspect of the present invention, a method forms a semiconductor device comprising isolation structures that selectively induce strain into active regions of NMOS and PMOS devices. Form a hard mask layer over a semiconductor body. A resist layer is formed on the hard mask layer that exposes and defines isolation regions. The hard mask layer is patterned and trench regions are formed using the hard mask layer as a mask. An oxide trench liner that induces compressive strain into active regions of the PMOS region is formed within trench regions of the PMOS region and the NMOS region. A subsequent etch process removes the oxide trench liner from the NMOS region. Then, a nitride trench liner that induces tensile strain into active regions of the NMOS region is formed within the NMOS trench regions. Subsequently, the trench regions are filled with a dielectric fill material and a planarization process is performed that removes excess fill material.

In accordance with another aspect of the present invention, targeted isolation regions and active regions of a semiconductor body are defined. Trench regions are formed within the semiconductor body by selectively etching the targeted isolation regions. Compressive strain inducing trench liners are formed within the trench regions of a PMOS region. Tensile strain inducing trench liners are formed within the trench regions of an NMOS region.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
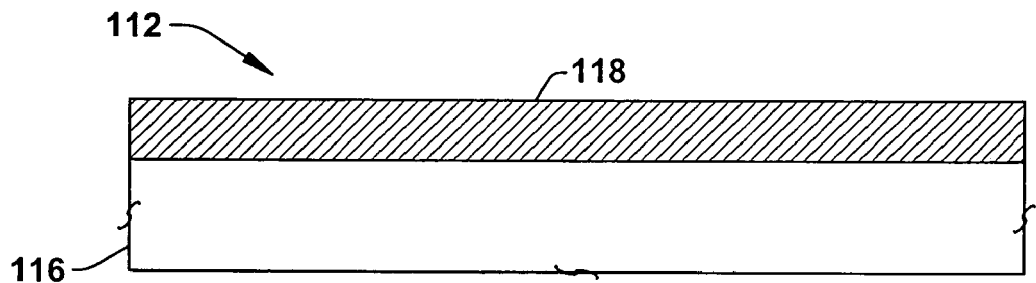
FIGS. 1 to 7 are prior art partial side elevation views in section illustrating a conventional shallow trench isolation process for providing isolation between active areas in a semiconductor device.
Figure 2:
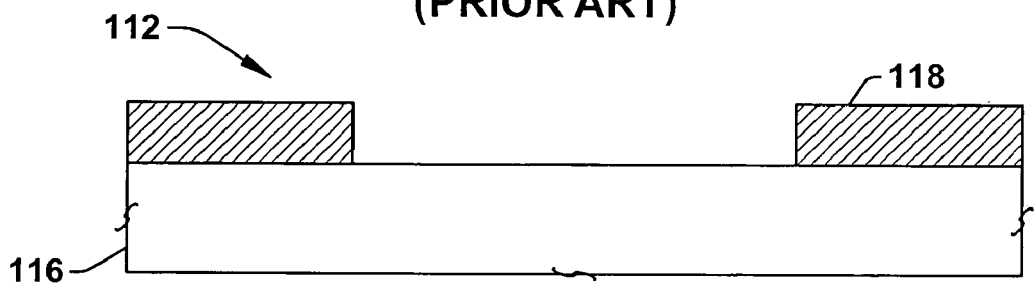

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

The present invention facilitates semiconductor device performance, particularly drive current, by fabricating trench liners that induce desired types and/or amounts of strain in regions of semiconductor devices. Compressive type strain/stress improves performance of NMOS devices but degrades performance of PMOS devices. Similarly, tensile type strain/stress improves performance of PMOS devices, but degrades performance of NMOS devices. The trench liners within NMOS regions are fabricated to induce tensile strain that improves drive current and the trench liners within PMOS regions are fabricated to induce compressive strain, which similarly improves drive current within the PMOS regions. The trench liners are selectively formed within each region with the appropriate type stress. As a result, strain induced performance is obtained for both PMOS and NMOS devices, without degrading performance for either.

In order to fully appreciate the various aspects of the present invention, a brief description of a conventional STI fabrication process as appreciated by the inventors of the present invention will be discussed. After a discussion thereof, the various aspects of the present invention will be disclosed and more fully appreciated.

In the fabrication of semiconductor devices, isolation structures are formed between active areas in which electrical devices such as transistors, memory cells, or the like, are to be formed. The isolation structures, in this case shallow trench isolation (STI) structures, are typically formed during initial processing of a semiconductor substrate, prior to the formation of such electrical devices.

STI isolation techniques involve the formation of shallow trenches in the isolation areas or regions of a semiconductor wafer, which are subsequently filled with dielectric material such as silicon dioxide ($SiO_2$) to provide electrical isolation between devices subsequently formed in the active regions on either side of the filled trenches. A mask, such as a resist mask, is formed over the substrate surface and patterned to expose only the isolation regions, with the prospective active device regions covered. An anisotropic (e.g., "dry") etch is then performed to form a trench through the substrate. Once the trench is etched, dielectric material is deposited to fill the trench with oxide. Thereafter, the device is commonly planarized using a chemical mechanical polishing (CMP) process.

Figure 3:
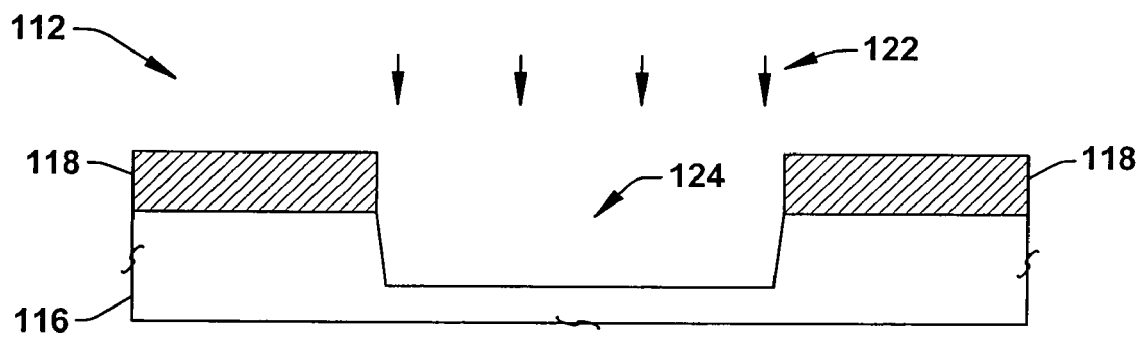
Figure 4:
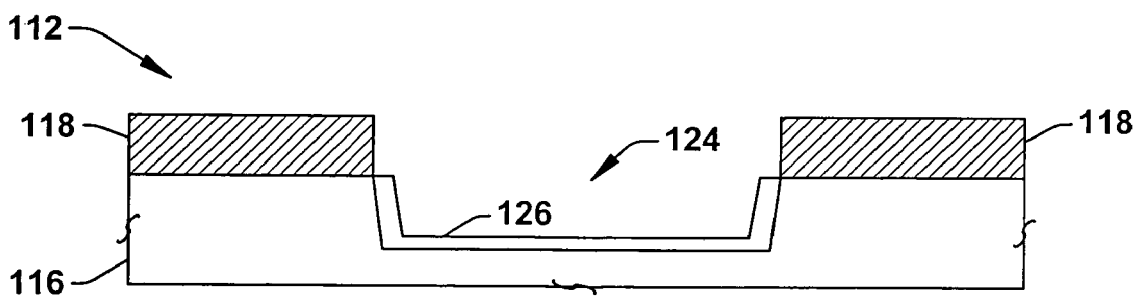

An example of a conventional STI process is illustrated in prior art FIGS. 1-7 to form trench isolation structures in a semiconductor device 112. In prior art FIG. 1, a mask 118 is formed over the device. The mask 118 is comprised of an etch resistant material such as silicon nitride or other suitable masking material. The mask is patterned in FIG. 2 to expose isolation regions of the device and cover active regions of the device. An etch 122 (e.g., a dry etch) is performed to form a trench 124 into the body region 116 as shown in FIG. 3. Subsequently, an oxide liner 126 is optionally formed in the trench 124 as shown in FIG. 4. The oxide liner 126 is formed by a thermal growth process.

Figure 5:
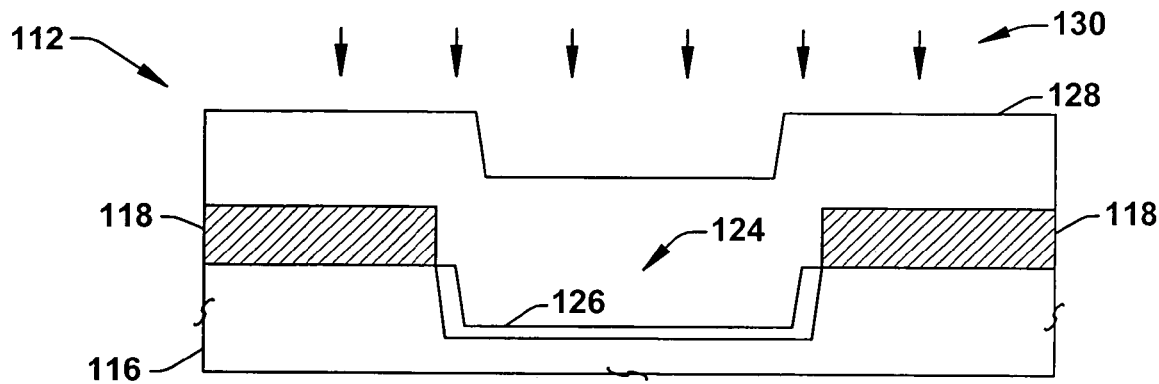
Figure 6:
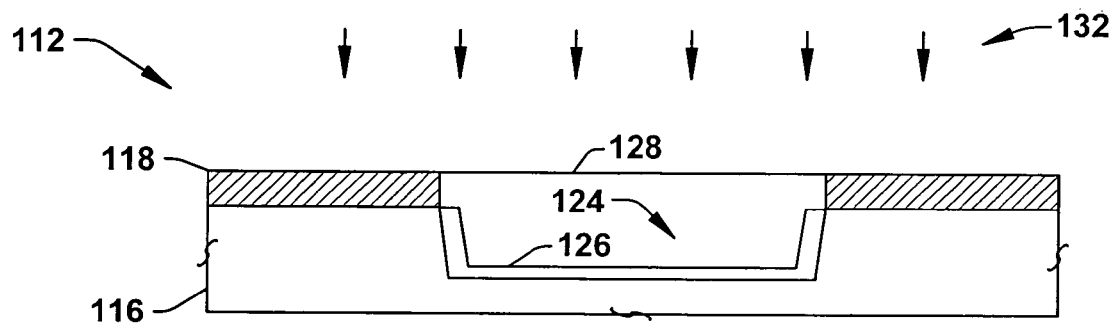
Figure 7:
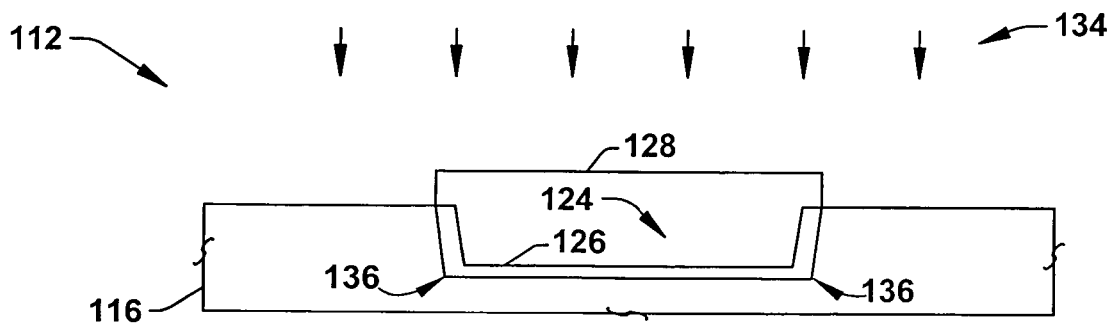

Once the trench 124 and the liner 126 are formed, a dielectric material 128 is deposited in prior art FIG. 5 via a deposition process 130 to fill the trench 124 and also to cover the active regions of the device 112. In prior art FIG. 6, a chemical mechanical polishing (CMP) or other planarization process 132 is employed to planarize the upper surface of the device 112, which exposes the remainder of the mask 118. Following planarization, the mask 118 is removed via a mask removal process 134 in prior art FIG. 7 to complete the isolation process, leaving the STI structure 128 in the trench 124.

The inventors of the present invention note that the conventionally formed STI structure 128 with the oxide liner 126 is fabricated in both NMOS and PMOS regions. The oxide liner 126 tends to induce compressive stress/strain on surrounding active regions. This induced compressive strain improves hole mobility for PMOS devices, thereby improving their performance, but degrades electron mobility for NMOS devices, thereby degrading their performance. It is also noted that the electron mobility degradation increases with scaling and, therefore, limits scaling of semiconductor device. For larger sized devices, the impact on the NMOS devices was sufficiently small that it was not a substantial problem.

Figure 8:
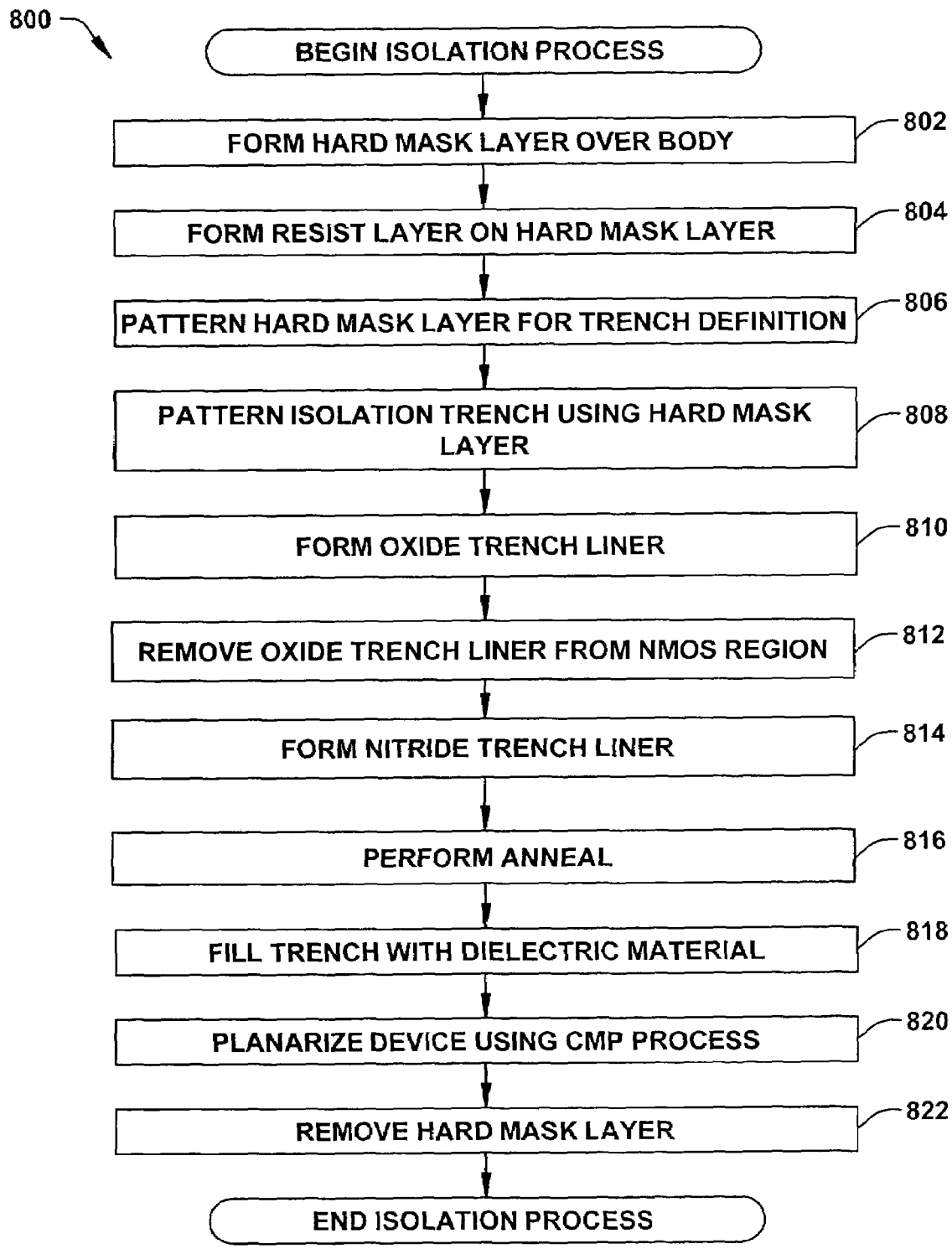
FIG. 8 is a flow diagram illustrating a method for forming isolation structures in a semiconductor device in accordance with an aspect of the present invention.

Referring now to FIG. 8, a flow diagram illustrating a method 800 for forming isolation structures in a semiconductor device in accordance with an aspect of the present invention is illustrated. While the method 800, and other methods according to the invention, are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

Beginning at block 802, a hard mask layer is formed over NMOS and PMOS regions a semiconductor body. The semiconductor body includes at least a portion of a wafer (e.g., a wafer die) and can include one or more layers of semiconductor materials, epitaxial layers, insulator layers, and the like. For example, the semiconductor body herein can include one or more layers of silicon, one or more layers of germanium, silicon on insulator (SOI) material, germanium on insulator (GOI) material, and the like.

A relatively thin pad oxide layer may be formed on the semiconductor substrate prior to formation of the hard mask layer by thermally growing oxide. The hard mask is comprised of a suitable material, such as nitride ($Si_3N_4$) and is deposited, for example, by a low pressure chemical vapor deposition (LPCVD) or other suitable deposition process. The hard mask layer mitigates damage to active regions of the device during formation of isolation regions.

Continuing at block 804, a resist mask layer is formed over the NMOS and PMOS regions of the device and on the hard mask layer that covers the active regions and exposes isolation regions. A photoresist material is deposited on the hard mask layer and patterned to expose the hard mask layer within the isolation regions and yet remain and cover the hard mask layer within the active regions.

The hard mask layer is then patterned using a suitable etch/patterning process and the resist mask layer as a mask at block 806 to expose underlying silicon of the isolation regions. The resist layer is then removed by a suitable resist removal process, such as an ashing process.

Subsequently, a trench formation process is performed at block 808 that etches the exposed portions of the semiconductor body within both the NMOS and PMOS regions to a selected depth, thereby forming trench regions. The etch process employed is typically selective to the material employed in the mask layer and etches into the semiconductor substrate within the exposed isolation regions so as to form the trench region having sidewalls, and a bottom. The width of the insulation trench is associated with the isolation opening(s) in the mask layer.

A number of suitable etch processes can be employed to form the trench regions at block 808. For example, a dry etch can be employed, which works well with hard mask layers. Additionally, reactive ion etching (RIE) can be employed. For example, a single or multi-step RIE etch process may be performed which removes material in the exposed isolation regions. Other suitable etch processes can also be employed.

An oxide trench liner is then formed within the trench regions of both the NMOS and PMOS regions at block 810. Typically, the oxide trench liner is formed by a thermal oxidation process. Some examples of suitable thermal oxidation processes follow below. Trans LC based oxidation, wherein furnace oxidation occurs in the presence of HCL can be employed. In situ steam generation (ISSG), wherein oxidation is performed mostly in single wafer tools and involves reaction of oxygen and hydrogen a body surfaces to form oxide can be employed. Another growth process that can be employed is low pressure radical oxidation (LPRO), wherein oxidation is performed as with ISSG, but in a furnace chamber. Water vapor generator (WVG), wherein water and oxygen are made to react at a low temperature (e.g., 400 degrees Celsius) in the presence of a catalyst, such as platinum, is another oxide formation process that can be employed. It is also appreciated that other oxide formation processes can also be employed.

The oxide trench liner is formed with a thickness that yields a desired and/or selected amount of strain and also facilitates filing of the trench regions and forming isolation regions. Some exemplary thicknesses include about 30 to 100 Angstroms, however it is appreciated that other suitable thicknesses can be employed.

It is noted that the oxide trench liner induces compressive stress/strain in surrounding active regions of the device. This strain improves hole mobility in subsequently formed PMOS devices, but degrades electron mobility in subsequently formed NMOS devices. As a result, the oxide trench liner is substantially removed from trench regions within the NMOS region at block 812 via a suitable etch process. A resist mask is employed that covers the PMOS region in order to prevent removal of the oxide trench liner there from. The resist mask exposes the NMOS region and an etch process selective to the hard mask material is performed that substantially removes the oxide trench liner from the NMOS region. The etch process employed can be an HF based wet chemistry etch process, a plasma etch process, or another suitable etch process.

The resist mask is then removed and a nitride trench liner is formed within the trench regions of both the NMOS and PMOS regions at block 812. The nitride trench liner forms on the oxide trench liner within the PMOS region and on surfaces of the trench regions within the NMOS region. In an alternate aspect of the invention, the resist mask is not removed and the nitride trench liner is only formed within the NMOS region.

The nitride trench liner can be formed via a number of suitable processes in order to obtain a desired thickness, stress amount, and stress type. One example of a suitable formation process is using NH3 and di-chloro silane in a furnace or single wafer tool. Such nitride trench liners yield tensile stresses of about 900 MPa. Another example of a suitable process is growing the nitride trench liner within a furnace or single wafer tool with BTBAS (bis-tetrabutyl amino silane). Typical liner produced by this process yield tensile stresses of about 1.5 GPa. Yet another example of a suitable process employs hexa chloro disilane (HCD) and NH3 to form the nitride trench liner. HCD formed nitride liners typically yield about 1.2 GPa. Other suitable nitride formation process can also be employed. The nitride trench liner is formed with a suitable thickness, such as about 30 Angstroms to about 100 Angstroms. However, it is appreciated that other thicknesses can be employed in accordance with the present invention.

The nitride trench liner, as formed, induces tensile strain within surrounding active regions of the NMOS region. The nitride trench liner and the oxide trench liner, in combination, result in inducing compressive strain in surrounding active regions of the PMOS region. As a result, electron mobility is improved within the NMOS region without degrading channel mobility within the PMOS region and hole mobility is improved within the PMOS region without degrading channel mobility within the NMOS region.

It is appreciated that variations in the method 800 are contemplated that form liners that yield appropriate stress within the PMOS and NMOS region. Variations in processes and compositions are contemplated as long as trench liners are formed that yield tensile strain inducing liner(s) within the NMOS region and compressive strain inducing liner(s) within the PMOS region.

Subsequently, an anneal is performed at block 816 after the formation of the nitride trench liner. The anneal serves to repair damage and/or mitigate uniformities within the trench region and the oxide and nitride trench liners.

At 818, the trench regions within the NMOS and PMOS regions are filled with dielectric material, such as $SiO_2$ or other electrically isolating material, so as to provide electrical isolation between active regions on either sides of the trench regions. The trench filling operation at 818 may comprise forming or depositing dielectric material over the device to cover the hard mask layer in the active regions and to fill the trenches in the isolation regions thereof. The trench fill material may be deposited at 818 using any appropriate deposition techniques, for example, such as high density plasma (HDP) oxide deposition, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS).

The device is then planarized at 820 to expose a portion of the hard mask layer in the active regions, leaving a generally planar upper surface with portions of the hard mask layer and a remaining portion of the fill material in the trench exposed. The remaining hard mask material is stripped or removed at 822 by a suitable removal process, such as using a wet etch process selective silicon to remove hard mask material and to stop on or before the silicon substrate (e.g., a pad oxide layer can be employed) without damaging the underlying silicon or other semiconductor material in the active regions of the device. The isolation method 800 then ends. Thereafter, transistors, memory cells, and/or other electrical devices may be formed in the active regions using semiconductor processing techniques as are known.

The fabrication of varied strain inducing trench liners for the PMOS and NMOS region facilitates channel mobility for both regions. The improved channel mobility is particularly significant for narrow width devices, such as devices less than 200 nm in width.

Referring now to FIGS. 9A to 9K, a semiconductor device formed in accordance with the exemplary method 800 of FIG. 8 is illustrated at various stages of fabrication. The stages of fabrication are exemplary in nature and are intended to facilitate a better understanding of the present invention. It is noted at this point that the illustrations provided herein are not necessarily drawn to scale, and that the above method 800 may be employed in processing structures other than those illustrated in the following figures, and further that the structures illustrated and described herein may be fabricated according to other techniques.

Figure 9A:
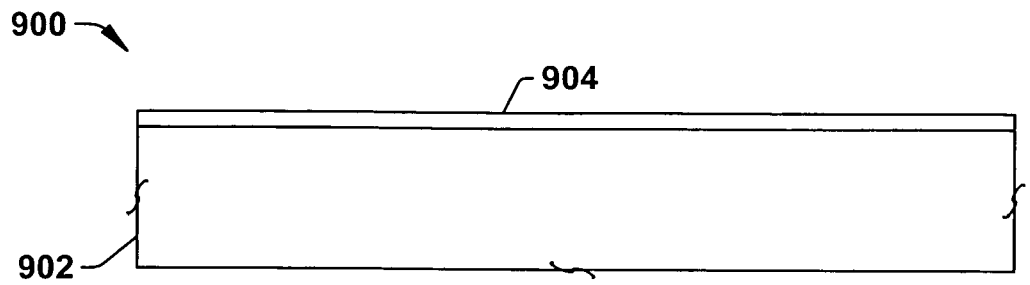
FIGS. 9A to 9K are a plurality of diagrams illustrating a semiconductor device at various stages of fabrication in accordance with an aspect of the present invention, such as the method of FIG. 8.

In FIG. 9A, the semiconductor device 900 is illustrated comprising a semiconductor body 902. The semiconductor body includes at least a portion of a wafer (e.g., a wafer die) and can include one or more layers of semiconductor materials, epitaxial layers, insulator layers, and the like. For example, the semiconductor body herein can include one or more layers of silicon, one or more layers of germanium, silicon on insulator (SOI) material, germanium on insulator (GOI) material, and the like. An oxidation process (not shown) is initially employed to grow a pad oxide layer 904 over the top surface of the substrate 902 as illustrated in FIG. 9A.

Figure 9B:
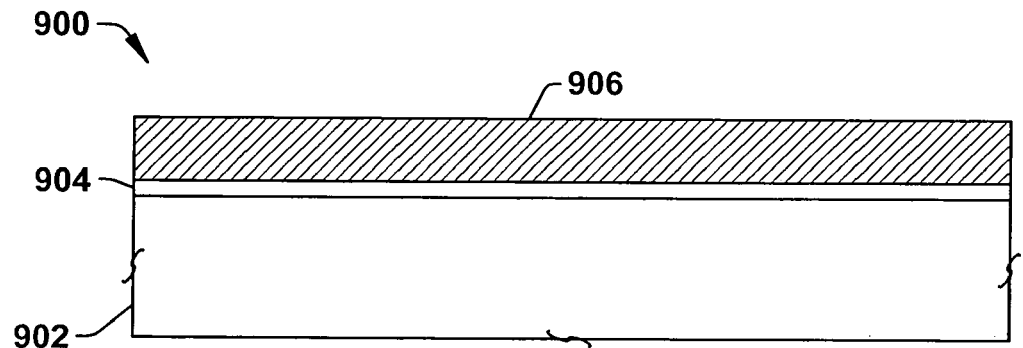

FIG. 9B illustrates a hard mask layer 906 formed on the pad oxide layer 904. The hard mask layer 906 is formed by depositing a hard mask material, such as silicon nitride. An exemplary process for forming the hard mask layer is a low pressure chemical vapor deposition (LPCVD) process of $Si_3N_4$. The hard mask layer mitigates damage to active regions of the device during subsequent formation of trench regions and isolation regions.

Figure 9C:
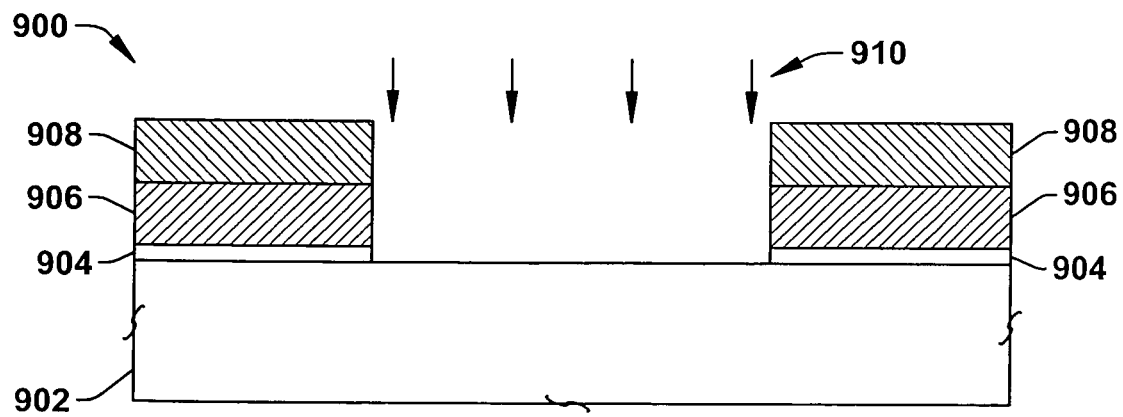

Thereafter, a patterned resist mask 908 (e.g., a developed photoresist) is formed to cover active regions of the device 900 while exposing the hard mask layer 906 in the isolation regions for subsequent trench formation therein. For example, a photoresist material can be deposited on the hard mask layer and then patterned to expose the hard mask layer within targeted isolation regions while remaining on the hard mask layer 906 within active regions. A dry etch process 910 is employed in FIG. 9C, in one example, to etch through the hard mask layer 906 and at least a portion of the pad oxide layer 904 to substantially expose the semiconductor body associated with the isolation region. FIG. 9C illustrates the device 900 with the resist mask 908 and after patterning the hard mask 906 and the pad oxide 904.

Alternatively, the etch process 910 may etch only the hard mask layer 906 and stop on the pad oxide layer 904. In yet another alternative, the etch process 910 may etch all of the exposed hard mask layer 906 and the underlying pad oxide layer 904 and land on the underlying semiconductor material. In another example, the etch process 910 is employed to partially etch the hard mask layer 906, wherein some portion of hard mask layer remains overlying the isolation regions. In one example, a remaining amount of the hard mask layer 906 may be about 1,000 Angstroms thick, however, other remaining thicknesses are contemplated by the present invention.

Figure 9D:
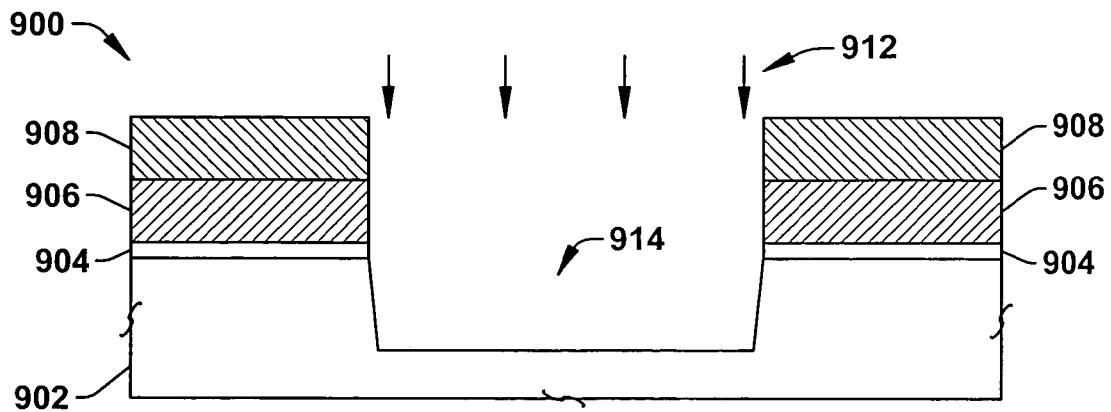
Figure 9E:
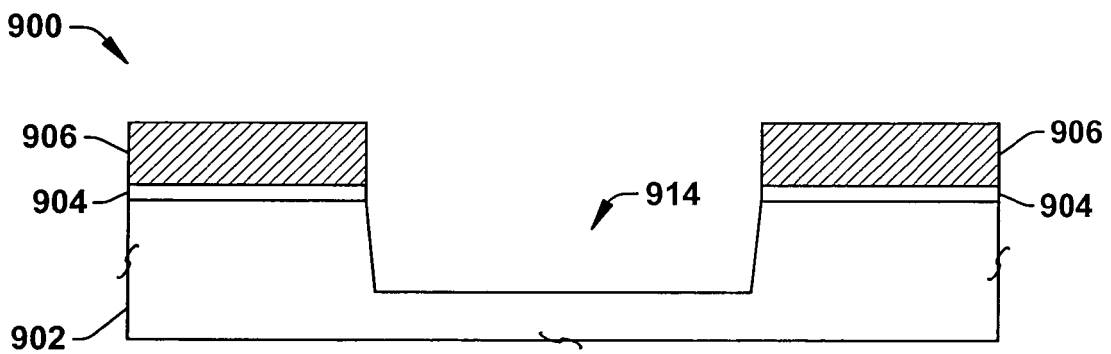

Continuing with respect to FIG. 9D, an etch process 912 is performed using the resist mask 908 to form isolation trench regions 914 to a depth and width in the isolation regions, where the trench regions comprises sidewalls and a bottom. The etch process employed is typically selective to the material employed in the mask layer and etches into the semiconductor substrate within the exposed isolation regions so as to form the trench region having sidewalls, and a bottom. Subsequently, the resist mask 908 is removed by a suitable process, such as an ashing process yielding the device 900 as formed in FIG. 9E.

Figure 9F:
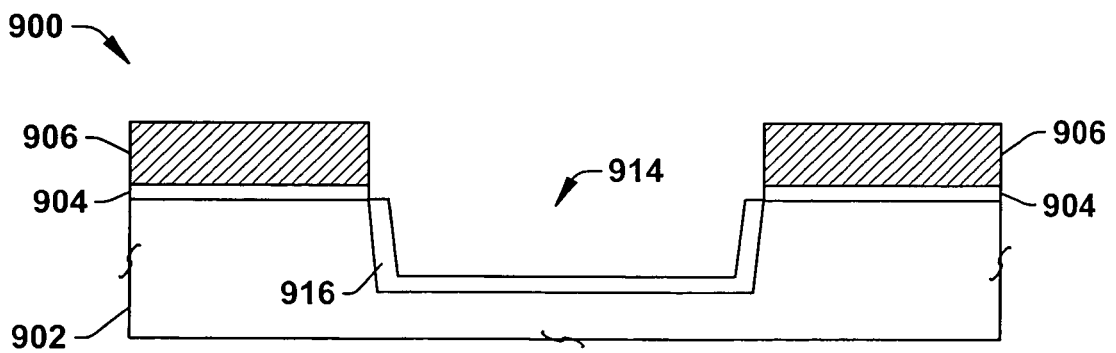

An oxide trench liner 916 is then formed on bottom and sidewall surfaces of the trench regions 914 as shown in FIG. 9F. The oxide trench liner is formed by an oxide growth process, such as described with respect to block 810 of FIG. 8. The oxide trench liner 916 induces compressive strain adjacent active regions of the device 900. The induced compressive strain improves hole mobility in subsequently formed PMOS devices, but degrades electron mobility in subsequently formed NMOS devices.

Figure 9G:
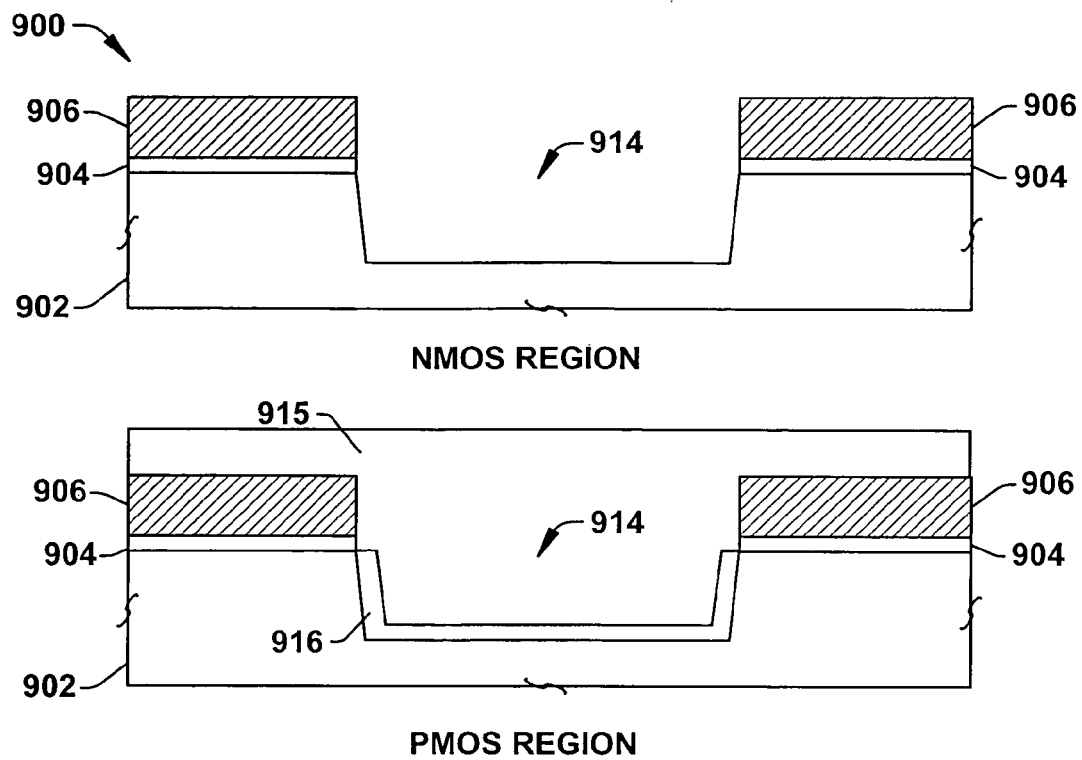

The oxide trench liner 916 is then substantially removed from trench regions 914 within the NMOS region, but not from trench regions within the PMOS region as shown in FIG. 9G. A trench resist mask 915 is employed that covers the PMOS region in order to prevent removal of the oxide trench liner there from and a suitable etch process is performed that is selective to the resist mask and the hard mask. The resist mask exposes the NMOS region and an etch process selective to the hard mask material is performed that substantially removes the oxide trench liner 916 from the NMOS region. After the portion of the oxide trench liner 916 is removed from the NMOS region, the trench resist mask 915 is removed.

Figure 9H:
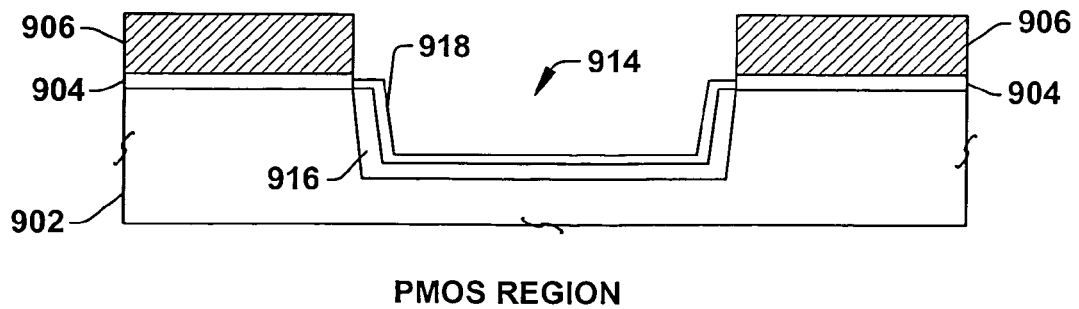

A nitride trench liner 918 is formed within the trench regions of both the NMOS and PMOS regions as shown in FIG. 9H. The nitride trench liner forms on the oxide trench liner 916 within the PMOS region and on surfaces of the trench regions 914 within the NMOS region. In an alternate aspect of the invention, the resist mask 915 is not removed and the nitride trench liner 918 is only formed within the NMOS region. The nitride trench liner 918 can be formed via a number of suitable processes in order to obtain a desired thickness, stress amount, and stress type.

Figure 9I:
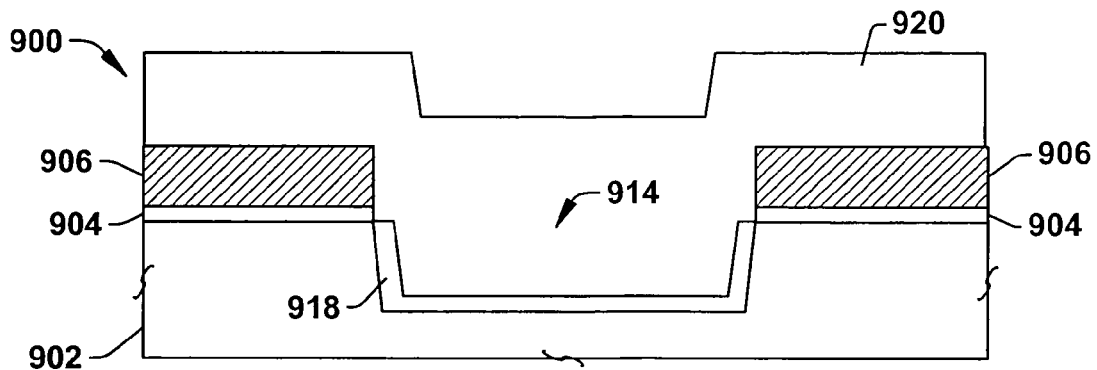
Figure 9I:
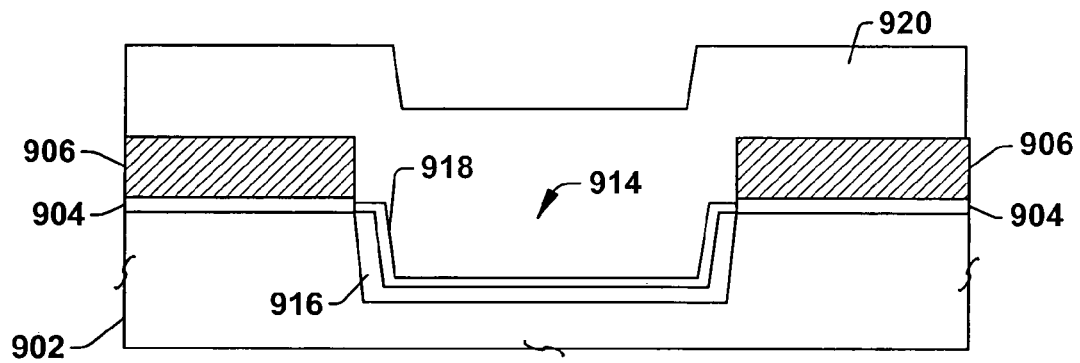

The trench regions 914 are then filled in with electrically isolating, dielectric material 920 via a deposition process as shown in FIG. 9I. The process involves a suitable deposition methodology, such as depositing $SiO_2$ or other isolating material using a high density plasma (HDP) oxide deposition process, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS), although other fill materials and deposition processes are contemplated as falling within the scope of the present invention.

Figure 9J:
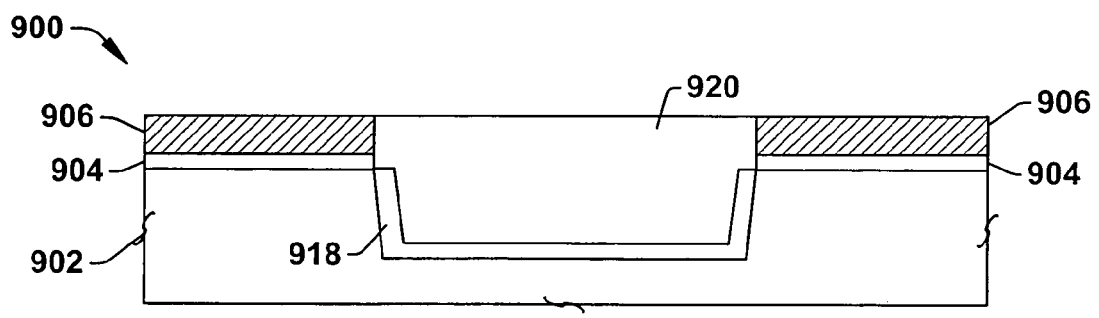
Figure 9J:
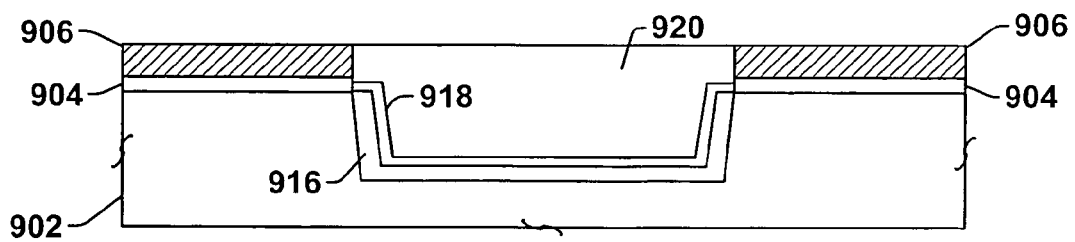
Figure 9K:
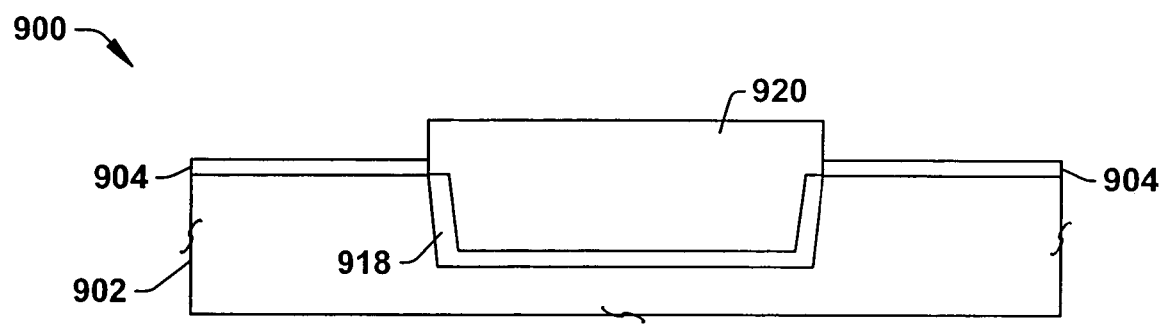
Figure 9K:
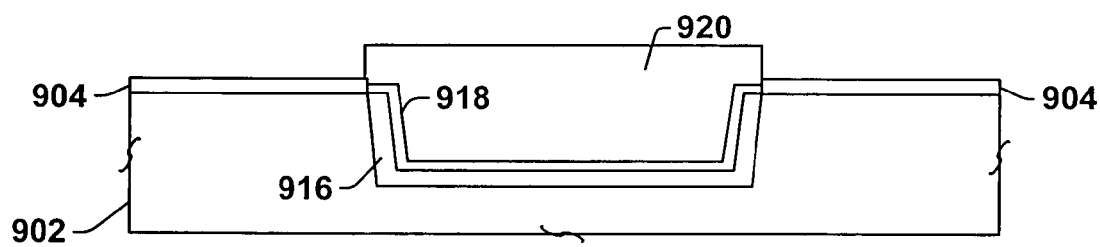

Continuing with FIG. 9J, a planarization process is performed to remove the upper portions of the fill material 920 as well as upper portions of the hard mask layer 906, wherein the hard mask layer 906 serves as a planarization stop. The process can comprise a chemical-mechanical polishing (CMP) process wherein a generally planar upper surface is provided in the device 900. Subsequently in FIG. 9K, the remainder of the hard mask layer 906 is stripped or otherwise removed, leaving finished STI isolation structures comprising the trench regions 914 lined with only the nitride trench liner 918 within the NMOS region and lined with the oxide trench liner 916 and the nitride trench liner 918 within the PMOS region. Additionally, the isolation structures further comprise the filled dielectric material 920.

Thereafter, transistors, memory cells, and/or other electrical devices (not shown) may be formed in the active regions using semiconductor processing techniques as are known.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a semiconductor device comprising isolation structures, the method comprising:
    defining isolation regions and active regions in NMOS and PMOS regions of a semiconductor body;
    forming trench regions within the isolation regions in the PMOS and NMOS regions;
    forming a first trench liner in the trench region within the NMOS region, wherein the first trench liner induces tensile strain into the active regions of the NMOS region; and
    forming a second trench liner in the trench region solely within the PMOS region, wherein the second trench liner induces compressive strain into the active regions of the PMOS region.

2. The method of claim 1, further comprising filling the trench regions with a dielectric fill material.

3. The method of claim 1, wherein forming the first trench liner comprises forming a nitride layer on bottom and sidewall surfaces of the trench regions solely within the NMOS region.

4. The method of claim 1, wherein forming the second trench liner comprises forming a silicon dioxide layer on bottom and sidewall surfaces of the trench regions solely within the PMOS region.

5. The method of claim 1, wherein forming the second trench liner comprises forming a silicon dioxide layer on bottom and sidewall surfaces of the trench regions solely within the PMOS region and forming a nitride layer on the silicon dioxide layer.

6. The method of claim 1, wherein forming the second trench liner comprises forming a nitride layer on bottom and sidewall surfaces of the trench regions within the PMOS region, wherein the formed nitride layer induces the compressive strain into the active regions of the PMOS region.

7. The method of claim 1, wherein forming trench regions within isolation regions comprises forming a resist mask that exposes the isolation regions and etching the exposed regions for a selected time to form the trench regions with bottom and sidewall surfaces.

8. The method of claim 1, wherein forming trench regions within isolation regions comprises forming a hard mask that exposes the isolation regions and etching the exposed regions to form the trench regions with bottom and sidewall surfaces.

9. The method of claim 8, wherein the hard mask is comprised of silicon nitride.

10. The method of claim 2, further comprising performing a planarization process to remove excess fill material and performing an anneal.

11. A method of fabricating a semiconductor device comprising isolation structures, the method comprising:
    defining isolation regions and active regions in NMOS and PMOS regions of a semiconductor body;
    forming trench regions within the isolation regions in the PMOS and NMOS regions;
    forming an oxide trench liner on bottom and sidewall surfaces of the trench regions within the PMOS and NMOS regions;
    etching the oxide trench liner from the NMOS region; and
    forming a nitride trench liner the bottom and sidewall surfaces of the trench regions within the NMOS region.

12. The method of claim 11, further comprising filling the trench regions with a dielectric fill material.

13. The method of claim 11, wherein forming the nitride trench liner comprises forming the nitride trench liner with a composition that induces tensile strain into the active regions of the NMOS region.

14. The method of claim 11, further comprising forming a resist mask that covers the PMOS region prior to etching the oxide trench liner from the NMOS region.

15. The method of claim 11, further comprising forming the nitride trench liner on the oxide trench liner within the PMOS region.

16. The method of claim 11, wherein forming the oxide trench liner comprises performing a thermal oxidation process.

17. The method of claim 11, wherein forming the nitride trench liner comprises growing nitride via a thermal process in the presence of di-chloro silane.

18. A method of fabricating a semiconductor device comprising isolation structures, the method comprising:
    selecting drive currents for NMOS and PMOS regions;
    defining isolation regions and active regions in NMOS and PMOS regions of a semiconductor body;
    forming trench regions within the isolation regions in the PMOS and NMOS regions;
    forming a tensile strain inducing trench liner within the NMOS region according to the selected drive current for the NMOS region;
    forming a compressive strain inducing liner within the PMOS region according to the selected drive current for the PMOS region;
    filling the trench regions within the NMOS and PMOS regions with a dielectric fill material; and
    removing excess dielectric fill material from surfaces of the device.

19. The method of claim 18, further comprising selecting an amount of induced strain that yields the selected drive current for the NMOS region and wherein forming the compressive strain inducing liner comprises forming a nitride layer with a composition that provides the selected amount of induced strain.

20. The method of claim 18, further comprising selecting an amount of induced strain that yields the selected drive current for the PMOS region and wherein forming the tensile strain inducing liner comprises forming a trench liner with a composition that provides the selected amount of induced strain.

21. The method of claim 18, wherein filling the trench regions comprises:
    forming a hard mask layer prior to forming the trench regions; and
    depositing an oxide material in the trench regions using a high density plasma deposition process.

22. The method of claim 18, further comprising forming transistor devices within the active regions of the semiconductor body.

* * * * *